(12) United States Patent
Eliashevich et al.

(10) Patent No.: US 6,746,889 B1
(45) Date of Patent: Jun. 8, 2004

(54) OPTOELECTRONIC DEVICE WITH IMPROVED LIGHT EXTRACTION

(75) Inventors: Ivan Eliashevich, South Orange, NJ (US); Hari Venugopalan, Somerset, NJ (US); Bob Karlicek, Twinsburg, OH (US); Stanton Weaver, Northville, NY (US)

(73) Assignee: Emcore Corporation, Somerset, NJ (US)

( * ) Notice: Subject to any disclaimer, the term of this patent is extended or adjusted under 35 U.S.C. 154(b) by 0 days.

(21) Appl. No.: 10/108,292

(22) Filed: Mar. 27, 2002

Related U.S. Application Data

(60) Provisional application No. 60/278,993, filed on Mar. 27, 2001.

(51) Int. Cl.[7] ................ H01L 20/00; H01L 20/301
(52) U.S. Cl. ................ 438/33; 438/42; 438/458; 438/464
(58) Field of Search ................ 438/106–128, 438/22–47

(56) References Cited

U.S. PATENT DOCUMENTS

| | | | |
|---|---|---|---|
| 5,454,002 A | | 9/1995 | McCann |
| 5,629,097 A | | 5/1997 | McCann |
| 5,776,794 A | | 7/1998 | McCann |
| 5,930,653 A | * | 7/1999 | Gaal |
| 6,071,795 A | | 6/2000 | Cheung et al. |
| 6,410,942 B1 | * | 6/2002 | Thibeault et al. |
| 6,417,019 B1 | * | 7/2002 | Mueller et al. |
| 6,448,102 B1 | * | 9/2002 | Kneissl et al. ................ 438/46 |
| 6,617,261 B2 | * | 9/2003 | Wong et al. ................ 438/778 |
| 2002/0030194 A1 | * | 3/2002 | Camras et al. ................ 257/98 |
| 2002/0139987 A1 | * | 10/2002 | Collins et al. |

OTHER PUBLICATIONS

D.W. McAlister, P.J. McCann, H.Z. Wu, and X.M. Fang, *Fabrication of Thin–Film Cleaved Using a Bonding and Cleaving Fixture*, IEEE Photonics Technology Letters, vol. 12, No. 1, pp. 22–24, Jan. 2000.

W.S. Wong and T. Sands, $In_xGa_{1-x}N$ *light emitting diodes on Si substrates fabricated by Pd—In metal bonding and laser lift–off*, Applied Physics Letters, vol. 77, No. 18, pp. 2822–2824, Oct. 30, 2000.

Kevin R. Lewelling and Patrick J. McCann, *Finite–Element Modeling Predicts Possibility of Thermoelectrically Cooled Lead–Salt Diode Lasers*, IEEE Photonics Technology Letters, vol. 9, No. 3, pp. 297–299, Mar. 1997.

* cited by examiner

*Primary Examiner*—Savitri Mulpuri
(74) *Attorney, Agent, or Firm*—Fay, Sharpe, Fagan, Minnich & McKee, LLP

(57) ABSTRACT

An improved method for producing optoelectronic devices such as light emitting diodes or laser diodes is provided. Light emitting diodes or laser diodes are provided with improved light extraction. Epitaxial layers including a light emitting p-n junction are deposited on a substrate, and separations are cut through the epitaxial layers to provide a structure including a plurality of individual dies on the substrate. The structure is mounted on a submount and the substrate is removed. An index matching material is then attached to improve light extraction from the optoelectronic device.

43 Claims, 3 Drawing Sheets

OCR not fully performed due to length

OPTOELECTRONIC DEVICE WITH IMPROVED LIGHT EXTRACTION

RELATED APPLICATIONS

The present application claims priority of Application Ser. No. 60/278,993, filed Mar. 27, 2001, the disclosure of which is hereby incorporated by reference.

FIELD OF THE INVENTION

The present invention generally relates to optoelectronic devices and more specifically relates to a method of manufacturing optoelectronic devices with improved light extraction.

BACKGROUND OF THE INVENTION

Optoelectronic devices such as light emitting diodes ("LEDs") and laser diodes ("LDs") are typically comprised of semiconductor material including thin epitaxial layers of two opposite conductivity types, referred to as p-type and n-type. The layers are disposed in a stack, one above the other, with one or more layers of n-type material in one part or region of the stack and one or more layers of p-type material in another part or region of the stack opposite from the n-type material. For example, the various layers or epitaxial layers may be deposited or grown in sequence on a substrate to form a wafer. The wafer is then separated or cleaved apart to form individual dies which constitute separate individual optoelectronic devices such as separate LEDs or LDs. The junction between the p-type and n-type material may include directly abutting p-type and n-type layers, or may include one or more intermediate layers which may be of any conductivity type or which may have no distinct conductivity type.

In operation, electric current passing through the diode is carried principally by electrons in the n-type layers and by electron vacancies or "holes" in the p-type layers. The electrons and holes move in opposite directions toward the junction and recombine with one another at the junction. Energy released by electron-hole recombination is emitted as light. As used in this disclosure, the term "light" includes radiation in the infrared and ultraviolet wavelength ranges, as well as radiation in the visible range. The wavelength of the light depends on factors including the composition of the semiconductor materials and the structure of the junction.

Electrodes are connected to the n-type and p-type layers near the top and bottom of the stack. The materials in the electrodes are selected to provide low-resistance interfaces with the semiconductor materials. The electrodes, in turn, are provided with pads suitable for connection to wires or other conductors which carry current from external sources. The pad associated with each electrode may be a part of the electrode, having the same composition and thickness of the electrode, or may be a distinct structure which differs in thickness, composition, or both from the electrode itself.

Some optoelectronic devices such as LEDs or LDs have electrodes on the bottom surface of the bottom epitaxial layer. For example, the various epitaxial layers may be deposited or grown in sequence on an electrically conductive substrate, and the substrate may be left in place on the bottom surface to act as a bottom electrode after individual dies are separated from the wafer. Typical LEDs or LDs formed from certain semiconductor materials, however, normally are grown on nonconductive substrates to promote proper formation of the semiconductor layers. Thus, if a nonconductive substrate is left in place, an electrode cannot be provided on the bottom surface of the bottom layer. For example, gallium nitride-based materials such as GaN, AlGaN, InGaN and AlInGaN are used to form LEDs or LDs emitting light in various wavelength ranges including blue and ultraviolet. These materials typically are grown on insulating substrates such as sapphire.

LEDs or LDs incorporating an insulating substrate must include a bottom electrode at a location on the stack above the substrate but below the junction. Typically, the upper layer or layers of the stack are removed after formation of the stack in a region covering part of the area of each die, so as to provide an upwardly-facing lower electrode surface on a layer at or near the bottom of the stack in each die. This leaves a region referred to as a "mesa" projecting upwardly from the lower electrode surface and covering the remaining area of the die. The area of the die occupied by the lower electrode surface does not emit light. Thus, it is desirable to keep the horizontal extent of this inactive area as small as possible.

Additionally, LEDs or LDs may be flip chip packaged, leaving the substrate material on the LED or LD die intact. Some optoelectronic devices, such as gallium-nitride based LEDs or LDs, are deposited or grown on sapphire substrates. Sapphire and other transparent substrate materials cause internal reflections between the substrate and the gallium-nitride based LED or LD, limiting light extraction from the device. Therefore, it is desirable to remove the substrate to improve light extraction from the device. Known methods of substrate removal include using a laser to delaminate the substrate from the semiconductor material of the wafer. Delamination of the substrate from the semiconductor material, however, causes problems such as cracking of the epitaxial layers due to thermal and mechanical stress during exposure to the laser. The epitaxial layers, therefore, are weakened and more prone to further chipping and damage upon separation into individual dies.

Lapping and polishing may also be utilized to remove the substrate from semiconductor material of the wafer. Lapping and polishing is disadvantageous because it is a mechanical process which exerts stress on the wafer and the active layers of the device. This stress can lead to immediate failure during the lapping as well as long term reliability issues. Moreover, lapping and polishing is extremely difficult to perform on a free, or insufficiently supported structure, resulting in low yields. Additionally, lapping and polishing are difficult to control. It is difficult to remove the substrate via lapping and polishing at the interface between the substrate and the epitaxial layers. Therefore, the last 10–20 microns of substrate thickness have to be removed by selective chemical etching which is not available for sapphire.

SUMMARY OF THE INVENTION

An improved method of manufacturing an optoelectronic device having improved light extraction is needed that includes removing the substrate from the epitaxial layers.

The present invention provides an improved method of manufacturing optoelectronic devices such as LEDs and LDs having improved light extraction. A method according to one aspect of the invention includes providing a substrate having first and second major surfaces and growing epitaxial layers on the first major surface of the substrate. The epitaxial layers desirably include a first region of a first conductivity type and a second region of a second conductivity type and a light-emitting p-n junction between the regions. The region of first conductivity type may be p-type, and the region of second conductivity type may be n-type.

Separations are formed through the epitaxial layers to the first major surface of the substrate to provide a structure including a plurality of individual dies or individual LED or LD devices on the first major surface of the substrate. The structure including the plurality of individual dies is preferably mounted to a submount to expose the second major surface of the substrate. The substrate is then removed from the structure.

For example, using a laser to delaminate the substrate from the structure. The laser used in the removal step desirably operates at a wavelength that is absorbed by the epitaxial layers and is not absorbed by the substrate.

Additionally, the removal step may include mechanically abrading the substrate. Such mechanical abrasion may involve lapping and polishing the substrate to expose epitaxial layers.

In another aspect of the invention, after the substrate material is removed, an index matching material having a refractive index greater than or, most preferably, substantially equal to the refractive index of the second region of the epitaxial layers is attached in place of the substrate. According to one embodiment of the invention, the index matching material is lens-shaped to improve light extraction from the device. The index matching material may be attached to the second region via dispensing the index matching material as a liquid, gluing or using epoxy to attach the index matching material.

The index matching material has a refractive index substantially equal to the geometric mean of the refractive index of the second region and the refractive index of the surrounding light guiding medium.

The index matching material is attached to the device via sputtering, spinning from a liquid, evaporation deposition, or through plasma enhanced chemical vapor deposition. The index matching material may be, for example, a polymer such as epoxy or silicone. In addition the index matching material may be glass, and may contain phosphor.

The separations desirably are formed using a laser, a saw blade, or dry or wet etching. The separations may be configured in various ways, according to the desired shape of the final optoelectronic device. Thus, the individual dies may be, for example, square-shaped or rectangular-shaped.

In one embodiment of the invention, the submount is comprised of, for example, sapphire, silicon, silicon carbide, ceramics and polyimide. The structure may be mounted to the submount using an adhesive. In another embodiment of the invention, the submount may be a permanent mount such as a circuit board, driver or an electronic circuit.

According to yet another aspect of the invention, the individual dies may be detached from the submount after the substrate has been removed. Thus, further processing may be done to the individual dies. The detaching may occur via thermal heating of the adhesive or using a solvent on the adhesive.

In preferred embodiments o the present invention removal of the substrate reduces internal reflections in the optoelectronic device and improves the light extraction. Substrate removal is facilitated by cutting separations through the LED or LD epitaxial layers to the surface of the substrate prior to removal of the substrate. Moreover, the addition of the index matching material further enhances light extraction of the device.

DETAILED DESCRIPTION OF THE PREFERRED EMBODIMENTS

Figure 1:
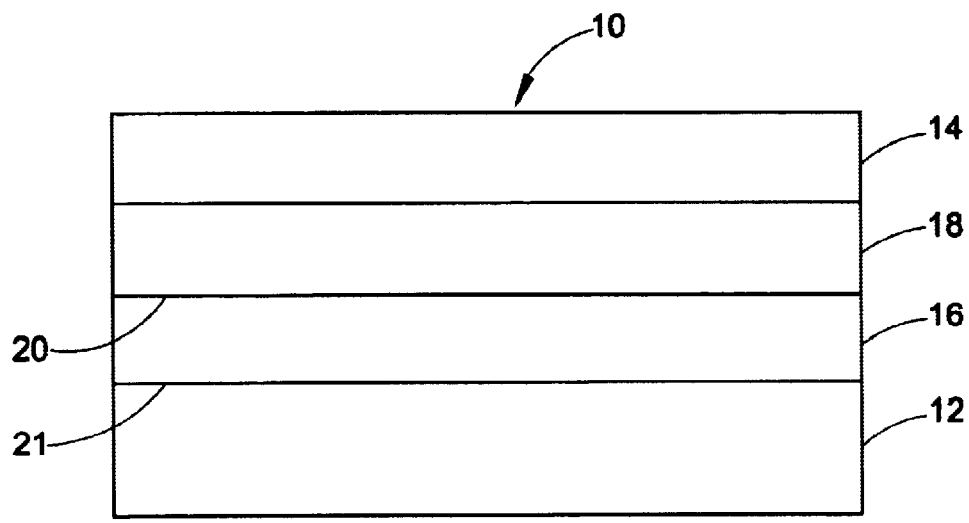
FIG. 1 is a front elevational view of a structure of epitaxial layers according to the invention prior to cutting separations in the epitaxial layers.

FIG. 1 shows an optoelectronic device 10 such as an LED or LD in accordance with one embodiment of the invention. The optoelectronic device comprises a substrate 12. The substrate may be, for example, a transparent, electrically insulating substrate such as sapphire or other aluminum oxide. The optoelectronic device further comprises layers of semiconductor material 14, 16 disposed on top of the substrate. The layers of semiconductor material include a first or upper region 14 of a first conductivity type and a second or lower region 16 of a second, opposite conductivity type adjacent substrate 12. For example, the first region 14 may be formed from a p-type semiconductor material whereas the second region 16 may be formed from an n-type semiconductor material. The material may be III-V semiconductors, materials such as GaN or InAlGaP. The p-type and n-type conductivity may be imparted by conventional dopants and may also result from the inherent conductivity type of the particular semiconductor material. For example, GaN based semiconductors typically are inherently n-type even when undoped. The n-type semiconductors may include conventional electron donor dopants such as Si, Ge, Se, and Te, whereas p-type semiconductors may include conventional electron acceptor dopants such as Be, Sr, Ba, Mg and Zn.

The optoelectronic device 10 includes a junction 18 between the first region 14 and second region 16. The junction is illustrated in FIG. 1 as a discrete layer interposed between regions 14 and 16 for clarity. In practice, however, the first region 14 and second region 16 may abut one another so that they define the junction at their mutual border. Alternatively, the junction 18 may include additional layer structures in the mutually adjacent portions of regions 14 and 16 or between these regions. Thus, the junction may be a simple homojunction, a single heterojunction, a double heterojunction, a multiple quantum well or any other type of junction structure. It should be understood that the disclosed optoelectronic device is intended as an example of a basic structure of an LED or LD for the purpose of this disclosure and not as a limitation.

In addition, the first region 14 and second region 16 may be formed of any number of layers. For example, the second region may incorporate a "buffer layer" at the interface with substrate 12, whereas the first region may incorporate a highly doped contact layer at the top of the stack to aid in establishing ohmic contact with a top electrode as is known in the art. The first region 14 and the second region 16 typically are transparent to light at the wavelength which will be emitted by the optoelectronic device in service. That is, one or both these regions typically are formed entirely or principally from materials having a band gap greater than the energy of the photons which will be emitted at the junction. The structure, composition and sequence of the various layers incorporated in the optoelectronic device may be selected according to known principles and techniques to provide the desired emission characteristics. The fabrication processes used to form optoelectronic devices such as LEDs and LDs are also well known. Most commonly, the various semiconductor layers which form the stacked structure of the optoelectronic device are deposited on the substrate in sequence by techniques such as metal organic chemical vapor deposition ("MOCVD") molecular beam epitaxy and the like.

Thus, in a first step of a method according to one embodiment of the invention, a substrate 12 is provided having first and second major surfaces 20 and 21. Epitaxial layers are grown on the first major surface 20 of the substrate. The epitaxial layers include the first region 14 of a first conductivity type and the second region 16 of a second conductivity type. The light-emitting p-n junction 18 is formed between the first region 14 and the second region 16.

Figure 2:
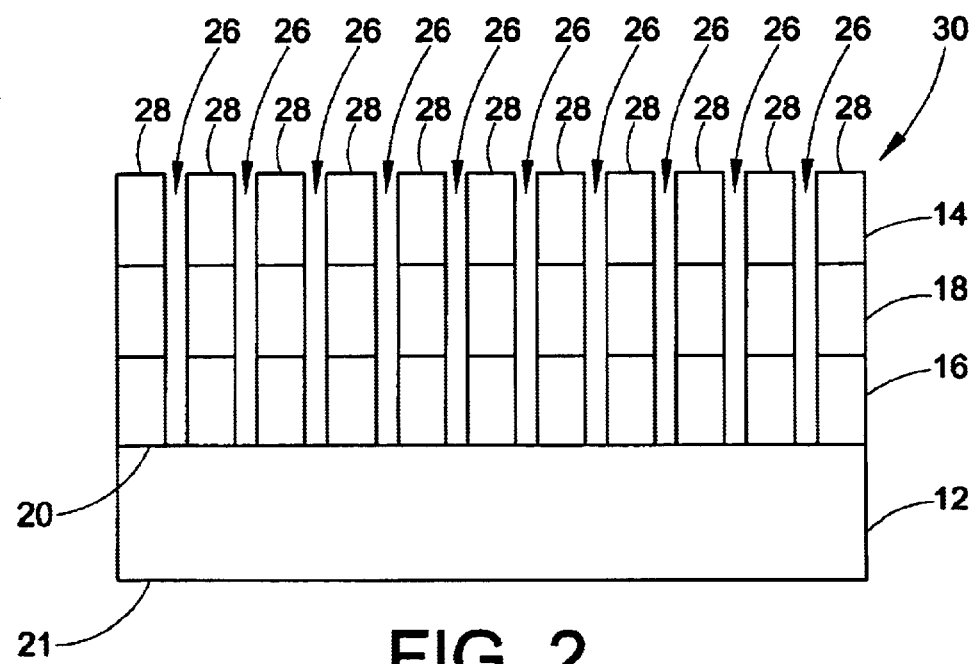
FIG. 2 is a front elevational view of the structure of FIG. 1 having separations cut in the epitaxial layers.
Figure 3:
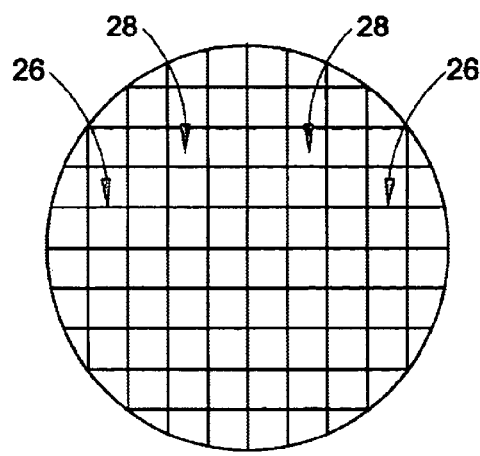
FIG. 3 is a top view of the structure showing separations cut in the epitaxial layers.

Referring now to FIGS. 2 and 3, the next step of a method of the invention is to cut separations 26 through the epitaxial layers of first region 14, second region 16 and junction 18. Preferably, the separations are about 20–30 microns wide. The separations are cut from the top of first region 14 through the layers to the first major surface 21 of the substrate 12. The separations 26 may be cut further into the substrate since it is difficult to stop the cutting at exactly the interface of second region 16 and substrate 12. Thus, the separations may be about 20–50 microns into the substrate. The separations 26, thus, cause a plurality of individual optoelectronic devices or dies 28, such as individual LEDs or LDs to form on the first major surface 21 of the substrate. Therefore, FIG. 2 shows a structure 30 including the substrate 21 and a plurality of individual dies 28. Preferably, the separations 26 are formed using a variety of known techniques in the art for cutting separations through semiconductor materials. For example, the separations can be made utilizing a laser operating at a wavelength and power appropriate for forming separations in semiconductor material. Alternatively, the separations can be made by a saw blade or etched using standard wet or dry etching techniques.

The present invention, of course contemplates that the number and configuration of the separations cut through the epitaxial layers will vary depending on the size of the original substrate and the desired size of the individual die or finished semiconductor devices. Thus, FIG. 3 shows a circular substrate having separations cut through the epitaxial layers to form individual dies 26 that are square-shaped. The configuration may be such, however, that the individual dies 26 are rectangular, triangular, hexagonal or of other configurations. In addition, the individual dies 28 desirably include electrodes (not shown), which may include bonding pads and wire leads. In some embodiments, additional layers may be provided for various special applications. For example, additional layers may include solder bumps or plated metal bumps, typically used in flip chip mounting.

Figure 4:
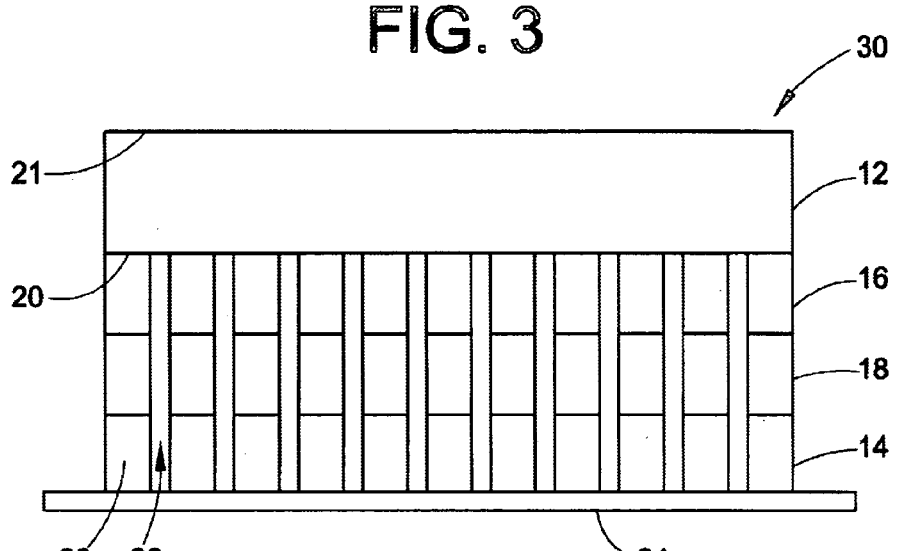
FIG. 4 is a front elevational view of the structure of FIG. 2 mounted to a submount.

Referring to FIG. 4, the next step of the method of the invention comprises mounting the structure 30 including the plurality of individual devices 28 to a submount 34 to expose the second major surface 21 of the substrate 12. The submount 34 may be a temporary mount for the structure 30, so that the individual devices 28 may be removed from the submount 34 for further processing. Preferably, the submount is comprised of a material having a Coefficient of Thermal Expansion substantially equal to that of the structure 30. Thus, the submount 34 may be comprised of, for example, sapphire, silicon, silicon carbide, ceramics and polyimide.

The structure 30 may be mounted to the submount 34 via any appropriate method for adhesion known in the art, including using low temperature melting waxes, aqueous or solventable waxes, thermoplastics, UV or thermal epoxies, polyimides or acrylics.

In addition, the structure 30 may be mounted to the submount 34 using low temperature wafer bonding, which includes depositing a bonding layer comprised of a low melting temperature metal, or solder layer such as Indium on the structure 30 or the submount 34. The structure 30 may then be mounted to the submount 34 under pressure, or preferably via melting. Alternatively, the structure may be bonded to the submount via flip-bonding using bonding pads. Preferably, the structure is mounted to a silicon or ceramic submount using solder bonding pads on the submount.

Alternatively, the submount 34 may be a device such as a driver or circuit board having connection or bond pads arranged to cooperatively match connection or bond pads of the dies to provide what is known as a flip chip arrangement.

After mounting the structure 30 to the submount 34, the substrate 12 is removed from the structure using known substrate removal techniques. For example, the substrate 12 may be removed by a laser operating at a wavelength absorbed by the epitaxial layers 14, 16 that form the individual devices 28 but not substantially absorbed by the substrate 12. By directing a laser onto the second major surface 21 of the substrate 12, heat will be generated at the interface between the substrate and the first major surface 20 of the substrate 12 eventually causing the die to delaminate from the devices 28.

Alternatively, mechanical abrasion processes can be utilized to remove the substrate from the epitaxial layers 14, 16 making up the individual devices 28. For example, lapping, polishing and/or grinding processes can be used to remove the substrate material. Since the structure 30 is mounted to the submount 34 during the lapping and polishing, the structure is sufficiently supported increasing the yield. Additionally, etching may be utilized in removal of the substrate. Of course, the present invention also contemplates that combinations of etching, laser removal and mechanical abrasion could also be utilized to remove the substrate.

Figure 5:
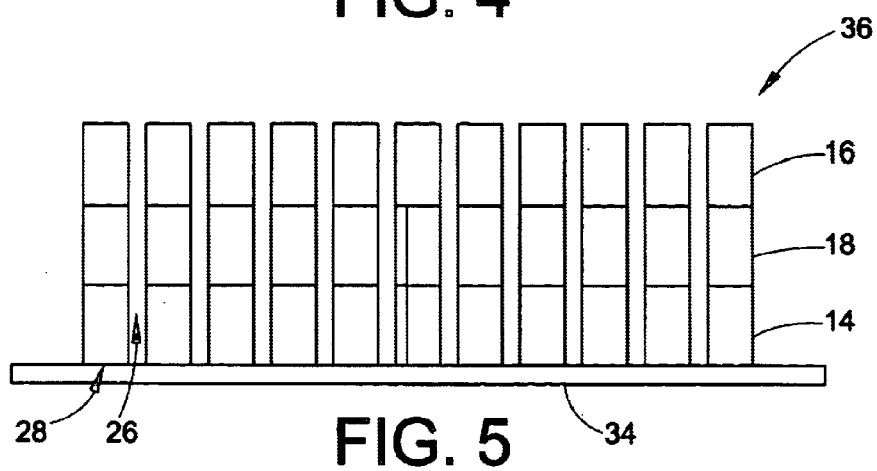
FIG. 5 is a front elevational view of the structure of FIG. 4 after the substrate has been removed.

The invention further contemplates growing a relatively thick epitaxial layers of semiconductor material, for example about 20 microns to about 100 microns thick or more. Thus, the stability of the individual dies is enhanced during the substrate removal process. The removal of the substrate 12 leaves an assembly 36 comprising the individual dies 28 disposed on the submount 34 (FIG. 5). Since separations 26 have been provided between the individual dies 28 prior to the step of removing the substrate from the structure 30, removal of the substrate from the devices 28 is facilitated. That is, a smaller amount of substrate must be removed from each individual die, making the removal process less tedious. After removal of the substrate 12 is complete, the structure 30 may be further separated into individual die-submount assemblies via cleaving or sawing. After cleaving or sawing, the die-submount assemblies are in their desired final form. Moreover, in instances where the submount 34 is a circuit board, the devices are already in position and no further processing is necessary. Therefore, the integrity of the devices is not at risk of degradation due to further exposure to a laser or other method of separation or cleaving.

If it is desired to have individual dies 28 picked off or removed from the submount 34, the individual dies 28 may be detached from the submount via mechanical pick and place, by thermal heating when low melting temperature metal, mounting wax, thermoplastic, or acrylic is used as the attachment adhesive, or by solvent to dissolve the adhesive.

Figure 6:
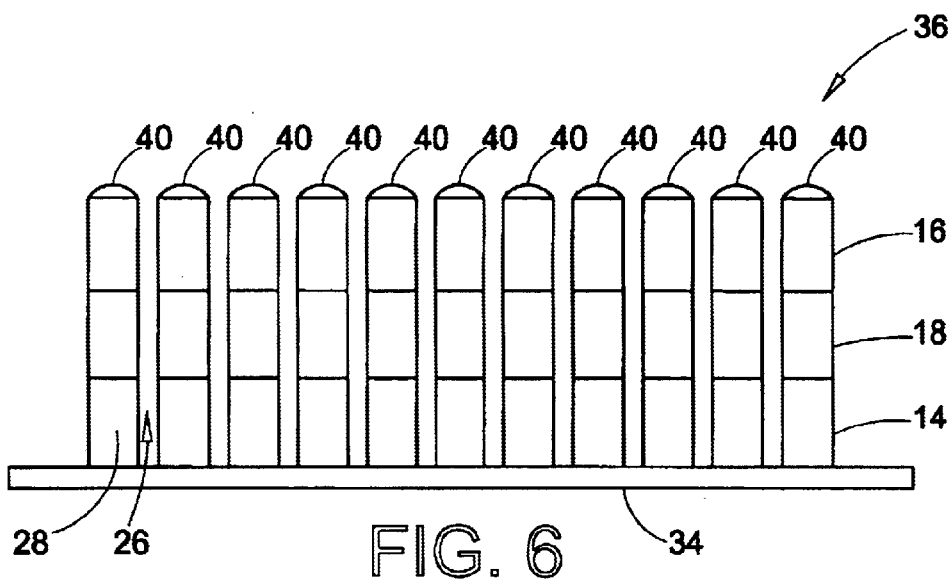
FIG. 6 is a front elevational view of the structure of FIG. 5 including index matching material according to one embodiment of the invention.

Referring now to FIG. 6, after the substrate has been removed, an index matching material 40 may be attached to the second region 16 of each of the individual dies 28. The index matching material preferably has a refractive index substantially equal to or greater than the refractive index of the region of the die which abuts such material. In the embodiment show in FIG. 6, second region 16 abuts the index material matching material 40. Preferably the index matching material is a polymer, for example, epoxy or silicone. The index matching material may also be glass. Preferably, the index matching material may contain phosphor. Thus, the substrate has been replaced by an index matching material 40 to improve light extraction from the dies 28. In addition, preferably the index matching material 40 is shaped as a semi-spherical or nearly semi-spherical lens as shown in FIG. 6 to maximize light extraction into surrounding light guiding medium such as air. The index matching material can be applied to the second region 16 by any suitable method such as dispensing a liquid, glue or epoxy attach. In one embodiment of the invention, the index matching material is an epoxy containing phosphor dispensed as a lens.

Figure 7:
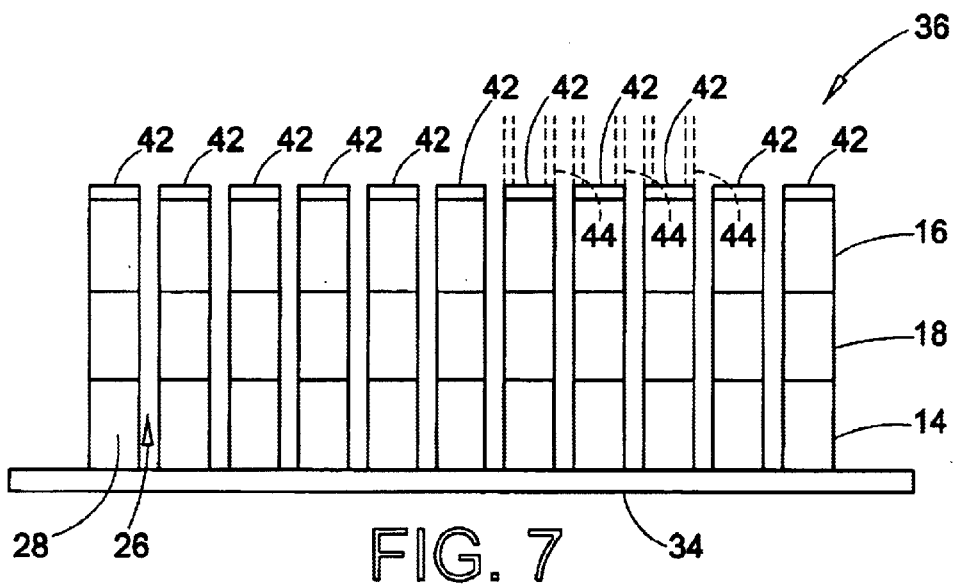
FIG. 7 is a front elevational view of the structure of FIG. 5 including index matching material according to another embodiment of the invention.

According to another embodiment of the invention, the index matching material is a flat layer 42 deposited by sputtering, spinning from a liquid, evaporation, deposition and plasma enhanced chemical vapor deposition (PECVD), as shown in FIG. 7. As shown in FIG. 7, light guiding medium 44 is attached to the index matching material via a mating medium. According to this embodiment, it is preferable that the index matching material has a refractive index equal to the geometric mean of the second region 16 and the index of the desired mating medium or light guiding material in order to achieve optimum light extraction into surrounding or mating medium. The mating medium or light guiding medium is the material in physical contact with the index matching material 42, opposite the epitaxial layers. Preferably, the mating medium and the light guiding medium is material with a high transmission in the emission wavelength region of the individual dies 28. Preferably, the mating medium is, for example, epoxy or acrylics, while the light guiding medium may be glass fibers, a light pipe or other light transmission medium. Preferably, the light guiding medium has a relatively high optical transmission in the range of 350–900 nm and refractive indices in the range of 1.35–1.75. Thus, the substrate has been removed and the light extraction has been increased in the optoelectronic devices through the use of the index matching material.

It should be appreciated that the figures are not drawn to scale. In particular, the thicknesses of the various layers have been greatly exaggerated for clarity of illustration. Typically, the entire stack is on the order of five microns thick, however, the stack may be made thicker as discussed above to facilitate removal of the substrate. The horizontal dimensions of the individual semiconductor dies, such as the overall die width W and die length L are usually on the order of a few hundred microns as, for example, about 200–300 microns. The die is typically rectangular or, most preferably, square with equal width and length.

Although the preferred embodiments have been described above with reference to particular semiconductor materials, it will be appreciated that the invention can be applied with dies formed from other semiconductor materials as well. Also, the conductivity types can be reversed, so that in some cases the first or upper region can be formed from n-type semiconductor material whereas the second or lower region may be formed from p-type semiconductor materials.

As these and other variations and combinations of the features discussed above can be utilized without departing from the present invention, the foregoing description of the preferred embodiments should be taken by way of illustration rather than by way of limitation of the invention as defined by the claims.

What is claimed is:

1. A method of manufacturing an optoelectronic device, comprising:
   (a) providing a substrate having first and second major surfaces;
   (b) growing epitaxial layers on the first major surface of the substrate, the epitaxial layers including a first region of a first conductivity type and a second region of a second conductivity type and a light-emitting p-n junction between the first region and the second region;

(c) forming separations of substantially equal depth through the epitaxial layers to about the first major surface of the substrate to provide a structure including a plurality of individual dies on the first major surface of the substrate;

(d) mounting the structure to a submount at the first region of the individual dies to expose the second major surface of the substrate; and (e) removing the substrate from the structure.

2. The method according to claim 1, wherein the step of removing includes using a laser to delaminate the substrate from the structure.

3. The method of claim 2, wherein the laser operates at a wavelength that is absorbed by the epitaxial layers and is not absorbed by the substrate.

4. The method of claim 1, wherein the step of removing includes mechanically abrading the substrate from the structure.

5. The method of claim 4, wherein the step of removing includes lapping and polishing the substrate to expose the epitaxial layers.

6. The method of claim 1, wherein the step of removing includes chemically etching the substrate.

7. The method according to claim 1, further comprising the step of attaching an index matching material to the second region of the individual dies, the index matching material having a refractive index substantially equal to or greater than the refractive index of the second region.

8. The method according to claim 7, wherein the step of attaching includes shaping the index matching material into a lens.

9. The method according to claim 8, wherein the step of attaching includes dispensing the index matching material as a liquid.

10. The method according to claim 8, wherein the step of attaching includes gluing the index matching material to the second region.

11. The method according to claim 8, wherein the step of attaching includes using epoxy to attach the index matching material to the second region.

12. The method according to claim 1, further comprising the steps of:
attaching an index matching material to the second region of each of the individual dies;
providing an light guiding medium surrounding the index matching material, the index matching material having a refractive index equal to a geometric mean of the refractive index of the second region and the refractive index of the light guiding medium.

13. The method according to claim 12, wherein the step of attaching includes sputtering the index matching material onto the second region to form a flat layer.

14. The method according to claim 12, wherein the step of attaching includes spinning the index matching material from a liquid onto the second region.

15. The method according to claim 12, wherein the step of attaching includes depositing the index matching material on the second region via evaporative deposition.

16. The method according to claim 12, wherein the step of attaching includes depositing the index matching material on the second region via plasma enhanced chemical vapor deposition (PECVD).

17. The method according to claim 7, wherein the index matching material is comprised of a material selected from the group consisting of polymer and glass.

18. The method according to claim 17, wherein the polymer is selected from the group consisting of epoxy and silicone.

19. The method according to claim 17, wherein the index matching material contains phosphor.

20. The method according to claim 12, the index matching material is comprised of material selected from the group consisting of polymer and glass.

21. The method according to claim 20, wherein the polymer is selected from the group consisting of epoxy and silicone.

22. The method according to claim 20, wherein the index matching material contains phosphor.

23. The method according to claim 1, wherein the step of forming separations includes using a laser to cut separations through the epitaxial layers to the first major surface of the substrate.

24. The method according to claim 1, wherein the step of forming separations includes using a saw blade to cut separations through the epitaxial layers to the first major surface of the substrate.

25. The method according to claim 1, wherein the step of forming separations includes dry etching the separations through the epitaxial layers to the first major surface of the substrate.

26. The method according to claim 1, wherein the step of forming separations includes wet etching the separations through the epitaxial layers to the first major surface of the substrate.

27. The method according to claim 1, wherein the step of forming separations includes configuring the separations to provide a plurality of individual square-shaped dies on the first major surface of the substrate.

28. The method according to claim 1, wherein the step of forming separations includes configuring the separations to provide a plurality of individual rectangular-shaped dies on the first major surface of the substrate.

29. The method according to claim 1, wherein the submount is comprised of material selected from the group consisting of sapphire, silicon, silicon carbide, ceramics and polyimide.

30. The method according to claim 29, wherein the step of mounting includes using an adhesive selected from the group consisting of low temperature melting waxes, aqueous waxes, solventable waxes, thermoplastics, W epoxies, thermal epoxies, polyimides, and acrylics to mount the structure to the submount.

31. The method according to claim 29, further comprising the step of heating the adhesive to detach the individual dies from the submount.

32. The method according to claim 29, further comprising the step of using a solvent on the adhesive to detach the individual dies from the submount.

33. The method according to claim 29, wherein the step of mounting includes:
providing a metal layer on the submount;
providing a low melting temperature metal on the first region of the structure; and
mounting the structure to the metal layer under pressure.

34. The method according to claim 1, wherein the submount is a device selected from the group consisting of a circuit board and an electronic circuit.

35. The method according to claim 34, wherein the step of mounting includes electrically connecting the individual dies to the device via bonding pads.

36. A method of manufacturing an optoelectronic device, comprising:
(a) providing a substrate having first and second major surfaces;
(b) growing epitaxial layers on the first major surface of the substrate, the epitaxial layers including a first region of a first conductivity type and a second region of a second conductivity type and a light-emitting p-n junction between the first region and the second region;
(c) forming separations through the epitaxial layers to about the first major surface of the substrate to provide a structure including a plurality of individual dies on the first major surface of the substrate;
(d) mounting the structure to a submount via an adhesive at the first region of the individual dies to expose the second major surface of the substrate, wherein the submount is comprised of material selected from the group consisting of sapphire, silicon, silicon carbide, ceramics and polyimide;
(e) removing substrate from the structure; and
(f) attaching an index matching material to the second region of each of the individual dies.

37. The method according to claim 36, comprising detaching the individual die from the submount for further processing.

38. The method according to claim 36, wherein the step of detaching includes heating the adhesive.

39. The method according to claim 36, wherein the step or detaching includes using a solvent on the adhesive.

40. The method according to claim 36, wherein the index matching material is selected from the group consisting of polymer and glass.

41. The method according to claim 40, wherein the step of attaching the index material includes shaping the index matching material into a lens, wherein the index matching material has a refractive index equal to the refractive index of the second region.

42. The method according to claim 40, wherein the step of attaching the index material includes shaping the index matching material into a flat layer, wherein the index matching material has a refractive index equal to a geometric mean of the refractive index of the second region and the refractive index of a light guiding medium attached to the index matching material.

43. A method of manufacturing an optoelectronic device, comprising:
(a) providing a substrate having first and second major surfaces;
(b) growing epitaxial layers on the first major surface of the substrate, the epitaxial layers including a first region of a first conductivity type and a second region of a second conductivity type and a light-emitting p-n junction between the first region and the second region;
(c) forming separations having a width in the range of about 20 microns to 30 microns through the epitaxial layers to about the first major surface of the substrate to provide a structure including a plurality of individual dies on the first major surface of the substrate;
(d) mounting the structure to a submount at the first region of the individual dies via solder bonding pads of the submount to expose the second major surface of the substrate;
(e) removing the substrate from the structure using a laser to delaminate the substrate from the structure;
(f) dispensing epoxy lenses containing phosphor onto the second region of the individual die; and
(g) cleaving the submount to form individual die-submount assemblies.

* * * * *